(12) United States Patent
McLean (10) Patent No.: US 12,334,295 B2
(45) Date of Patent: Jun. 17, 2025

(54) SOLID STATE CIRCUIT BREAKER SNUBBER

(71) Applicant: Hamilton Sundstrand Corporation, Charlotte, NC (US)

(72) Inventor: Andrew McLean, Halesowen (GB)

(73) Assignee: Hamilton Sundstrand Corporation, Charlotte, NC (US)

( * ) Notice: Subject to any disclaimer, the term of this patent is extended or adjusted under 35 U.S.C. 154(b) by 96 days.

(21) Appl. No.: 18/204,847

(22) Filed: Jun. 1, 2023

(65) Prior Publication Data

US 2023/0395335 A1  Dec. 7, 2023

(30) Foreign Application Priority Data

Jun. 2, 2022 (EP) ...................................... 22275075

(51) Int. Cl.
*H02M 1/34* (2007.01)
*H01H 9/54* (2006.01)

(52) U.S. Cl.
CPC ............ *H01H 9/541* (2013.01); *H02M 1/344* (2021.05)

(58) Field of Classification Search
CPC .................................. H01H 9/54; H02M 1/344
See application file for complete search history.

(56) References Cited

U.S. PATENT DOCUMENTS

| | | | |
|---|---|---|---|
| 4,322,772 A | 3/1982 | Fry | |
| 6,104,106 A * | 8/2000 | Partridge | ......... H03K 17/08144 |
| | | | 307/130 |
| 6,813,172 B2 | 11/2004 | Park | |
| 8,203,815 B2 | 6/2012 | Kilroy et al. | |
| 8,847,656 B1 | 9/2014 | A et al. | |
| 10,498,222 B2 | 12/2019 | Ou et al. | |
| 10,651,838 B2 | 5/2020 | Haugan | |
| 10,811,864 B2 | 10/2020 | Dupraz | |
| 11,071,225 B2 | 7/2021 | Namuduri et al. | |
| 2010/0277006 A1 * | 11/2010 | Urciuoli | .............. H01L 29/8083 |
| | | | 307/130 |

(Continued)

FOREIGN PATENT DOCUMENTS

CN   108736874 A   11/2018
EP     2675051 A2   12/2013

(Continued)

OTHER PUBLICATIONS

Asad "Design Considerations for High-Voltage High-Current Bi-Directional DC Solid-State Circuit Breaker" (Year: 2021).*

(Continued)

*Primary Examiner* — Sisay G Tiku (57) ABSTRACT

A snubber circuit for a solid state circuit breaker (SSCB), the snubber circuit comprising a series connected capacitor and transient voltage suppressor, TVS, connected across switches of the SSCB, and a bidirectional solid state circuit breaker comprising: a main SSCB circuit configured to be connected between a power supply and a load, and comprising first and second semiconductor switches connected in series, and a snubber circuit as described above having a first end connected to a first end of the first semiconductor switch and a second end connected to a second end of the second semiconductor switch.

20 Claims, 8 Drawing Sheets

(56) References Cited

U.S. PATENT DOCUMENTS

| | | | |
|---|---|---|---|
| 2011/0267132 A1* | 11/2011 | Lubomirsky | H03K 17/08142 327/430 |
| 2014/0029152 A1* | 1/2014 | Mazzola | H03K 17/6871 361/115 |
| 2015/0280417 A1* | 10/2015 | Shen | H02H 3/087 361/100 |
| 2019/0020264 A1* | 1/2019 | Ou | H02M 7/2176 |
| 2021/0036695 A1 | 2/2021 | Qiao et al. | |
| 2021/0288636 A1 | 9/2021 | Song et al. | |
| 2021/0305980 A1* | 9/2021 | Sim | H02H 7/008 |
| 2021/0376600 A1 | 12/2021 | Torres et al. | |
| 2022/0045506 A1* | 2/2022 | Wang | H02H 7/268 |
| 2022/0209765 A1* | 6/2022 | Song | H03K 17/08104 |
| 2022/0231684 A1* | 7/2022 | Mehrotra | H03K 17/162 |
| 2023/0163587 A1* | 5/2023 | Lu | H03K 17/687 361/93.1 |
| 2023/0187923 A1* | 6/2023 | Lu | H01H 9/54 361/93.1 |
| 2024/0313522 A1* | 9/2024 | Wang | H02H 9/04 |

FOREIGN PATENT DOCUMENTS

| | | | | |
|---|---|---|---|---|
| WO | WO-9801939 A1 | | 1/1998 | |
| WO | WO-2020106964 A1 | * | 5/2020 | H01C 7/12 |
| WO | WO-2022211605 A1 | * | 10/2022 | H02H 1/0007 |
| WO | WO-2024180008 A1 | * | 9/2024 | H03K 17/08142 |

OTHER PUBLICATIONS

Asad "Paralleling of Transient Overvoltage Protection Elements within High Power DC Solid-State Circuit Breaker (SSCB) for Electric/Hybrid-Electric Aircraft" (Year: 2022).*

Extended European Search Report for European Patent Application No. EP22275075.4, dated Nov. 10, 2022.

* cited by examiner

FIG. 1

Prior Art

SOLID STATE CIRCUIT BREAKER SNUBBER

CROSS-REFERENCE TO RELATED APPLICATIONS

This application claims priority to and the benefit of European Patent Application No. 22275075.4, filed Jun. 2, 2022, the entire content of which is herein incorporated by reference.

TECHNICAL FIELD

The present disclosure relates to the field of solid state circuit breakers (SSCBs) and a snubber for an SSCB.

BACKGROUND

Circuit breakers are used in systems to isolate circuit functions and/or to prevent fault propagation in the event of a fault within the circuit. If a fault such as a short circuit occurs, an over-current condition is detected and the switch is automatically opened, cutting off power and preventing any damage to the circuit. In the past, this has been accomplished using electromechanical switches. These switches can experience problems with arcing during turn-off and bouncing during turn-on. Because of this, electromechanical circuit breakers can experience severe degradation over time. Further, electromechanical switches are often large and bulky, increasing the necessary size and weight of the circuit breaker.

In order to remedy the problems of electromechanical circuit breakers, solid state circuit breakers are often used. Solid state circuit breakers (SSCBs) utilise solid state power switches which provide relatively fast response times compared to electromechanical switches, and are very small, which is ideal for systems such as those on an aircraft. These solid state switches also do not suffer from problems of arcing during turn-off transient. However, solid state switches can encounter problems with EMI noise during switching and overvoltage stress on the solid state switching device during turn-off transients.

SSCBs are now being used more and more widely, for example in many aerospace and automotive power distribution systems. Applications requiring DC voltage isolation are often targeted for solid state implementation, more so than applications with multiplexed high power VSI motor loads or AC power distribution, but they can also be used in such applications. SSCBs are composed of semiconductor devices, and have the advantage of fast breaking, long contact life and a degree of intelligence, and therefore have high potential for use in the field of low-voltage protection. However, one problem with SSCBs is the risk of damage to the SSCB itself due to voltage surges from inductive loads. Inductive loads can store a large amount of energy. When the contact is broken, an inductive discharge spike occurs. This is less of a problem for mechanical switches, but does risk damage to a solid state switch e.g. a MOSFET which generally dissipates this energy in avalanche mode. Currently available MOSFETS are limited as regards the amount of energy that can be dissipated during avalanche mode and the selection of a suitable device creates challenges.

There is a need to provide a SSCB circuit which is capable of isolating supply phases during normal conditions and fault conditions, that protects the solid state device when an inductive load is disconnected by the SSCB whilst maintaining the benefits of SSCBs in terms of low cost, small size and weight, fast response times etc.

SUMMARY

According to one aspect, the present invention provides a snubber circuit for a solid state circuit breaker (SSCB), the snubber circuit comprising a series connected capacitor and transient voltage suppressor, TVS, connected across switches of the SSCB.

Also provided is a bidirectional solid state circuit breaker comprising: a main SSCB circuit configured to be connected between a power supply and a load, and comprising first and second semiconductor switches connected in series, and a snubber circuit as defined above having a first end connected to a first end of the first semiconductor switch and a second end connected to a second end of the second semiconductor switch.

BRIEF DESCRIPTION

Examples of a SSCB circuit according to the disclosure will now be described with reference to the drawings. It should be noted that variations are possible within the scope of the claims.

DETAILED DESCRIPTION

Figure 1:
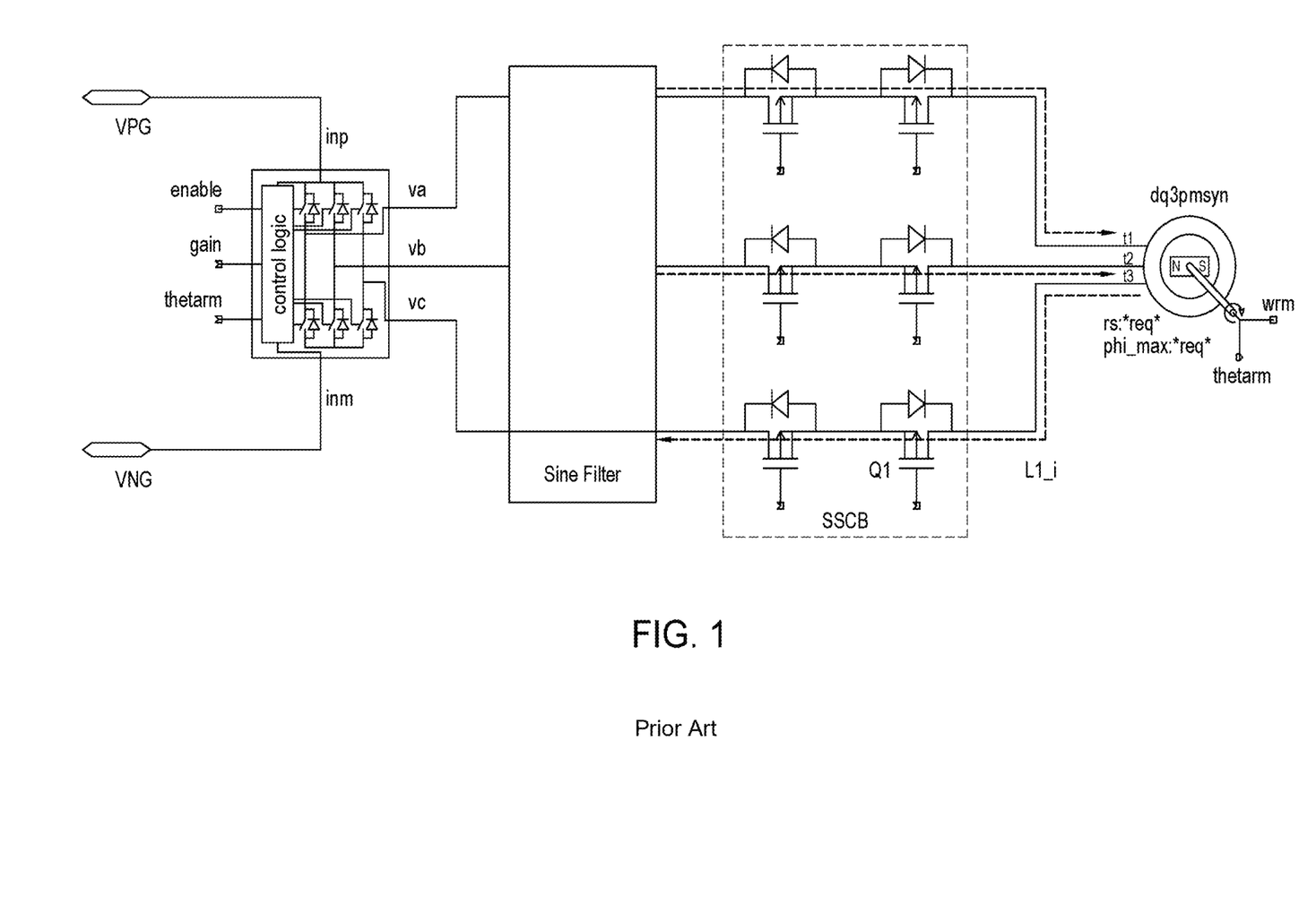
FIG. 1 shows a conventional bi-directional SSCB circuit.
Figure 1A:
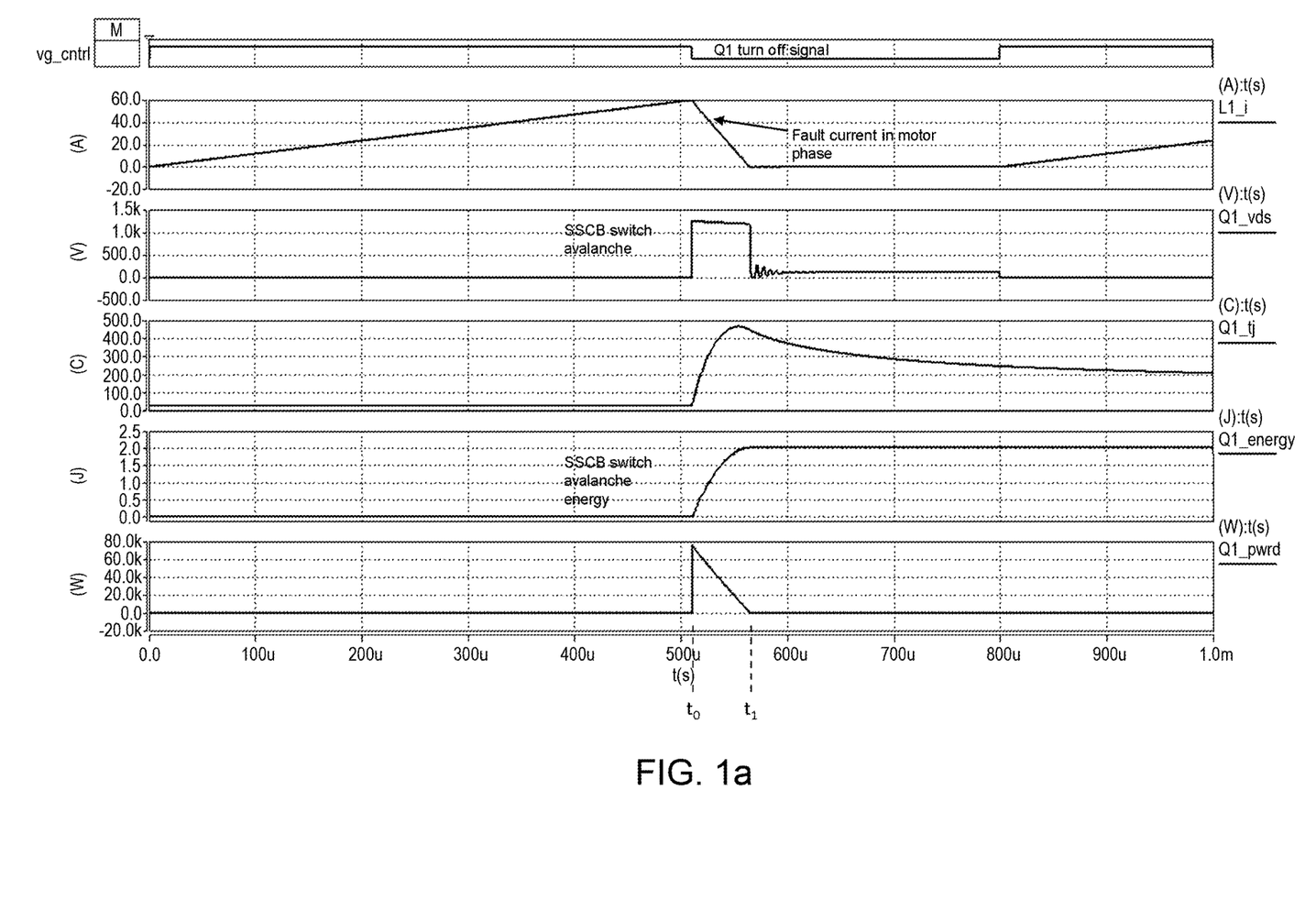
FIG. 1a shows a time-line chart showing the behaviour of one of the solid state devices of the circuit of FIG. 1.

Referring first to FIG. 1, this shows a conventional SSCB for a three phase application. Each phase includes a solid state switch (e.g. a MOSFET). The graph of FIG. 1a shows, in the top row, the motor current for one of the three phases. The behaviour will be the same for each phase and so, for simplicity, only one phase will be described.

At time $t_0$, the circuit breaker switch Q1 is turned off and the inductive load current (L1_$i$) falls rapidly to a minimum. The second row of the time graph shows the switch voltage (Q1_vds) which rapidly increases, when the current falls, to the switch avalanche voltage. The bottom line of the time graph shows how the switch power (Q1_pwrd) increases at turn off and then rapidly falls to zero at $t_1$. The fourth row shows the SSCB switch avalanche energy (Q1_energy) which quickly ramps up to a high level during the switch avalanche condition. The resulting high energy causes a significant increase in switch junction temperature (Q1_tj) shown in the third row, which gradually reduces once the switch power dissipation reduces to zero at $t_1$. Thus it can be seen that when the current is interrupted abruptly by the SSCB, the inductive load creates a back emf from the stored energy. The energy is high and can drive the switch into avalanche and destruction if the switch is not sufficiently highly rated (which either limits the use of conventional switches or requires large and expensive components).

Figure 2:
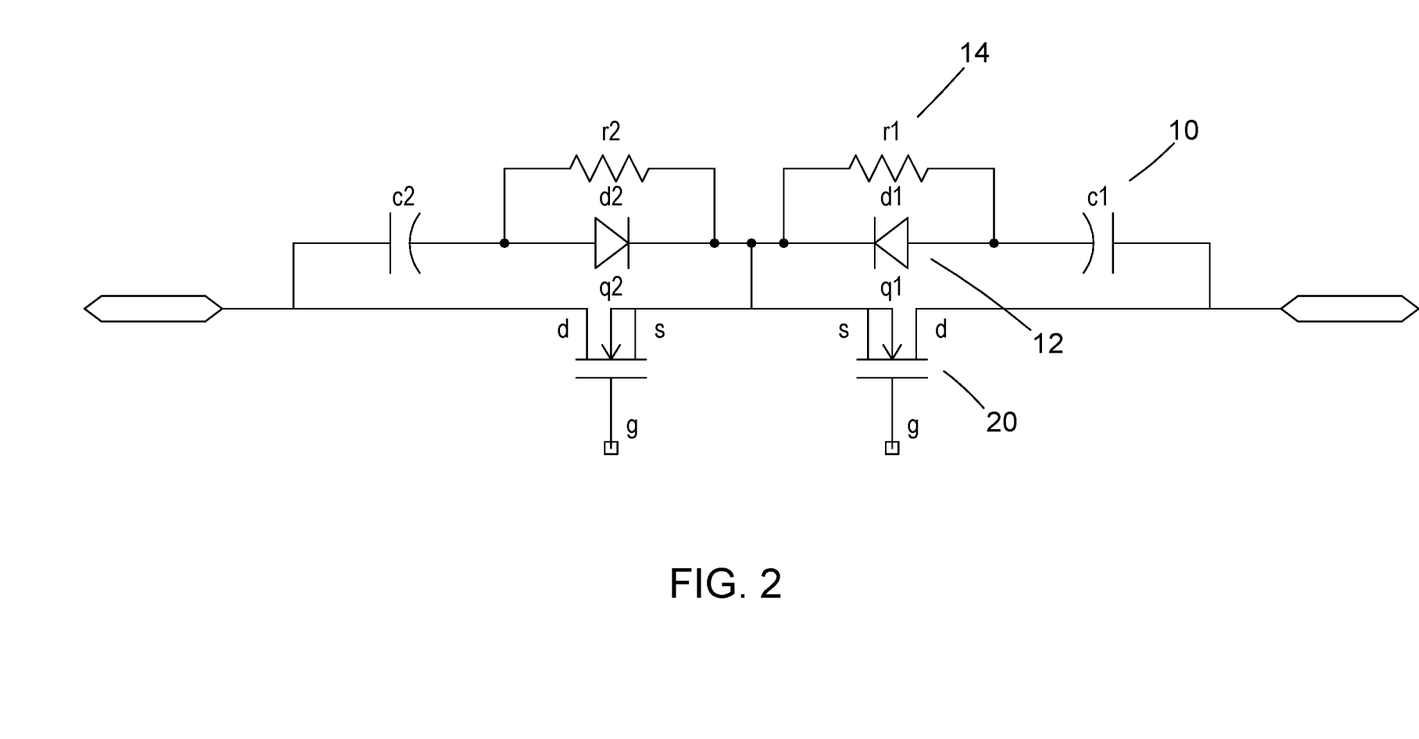
FIG. 2 shows a known snubber solution to address the inductive turn-off spike problem discussed above.
Figure 2A:
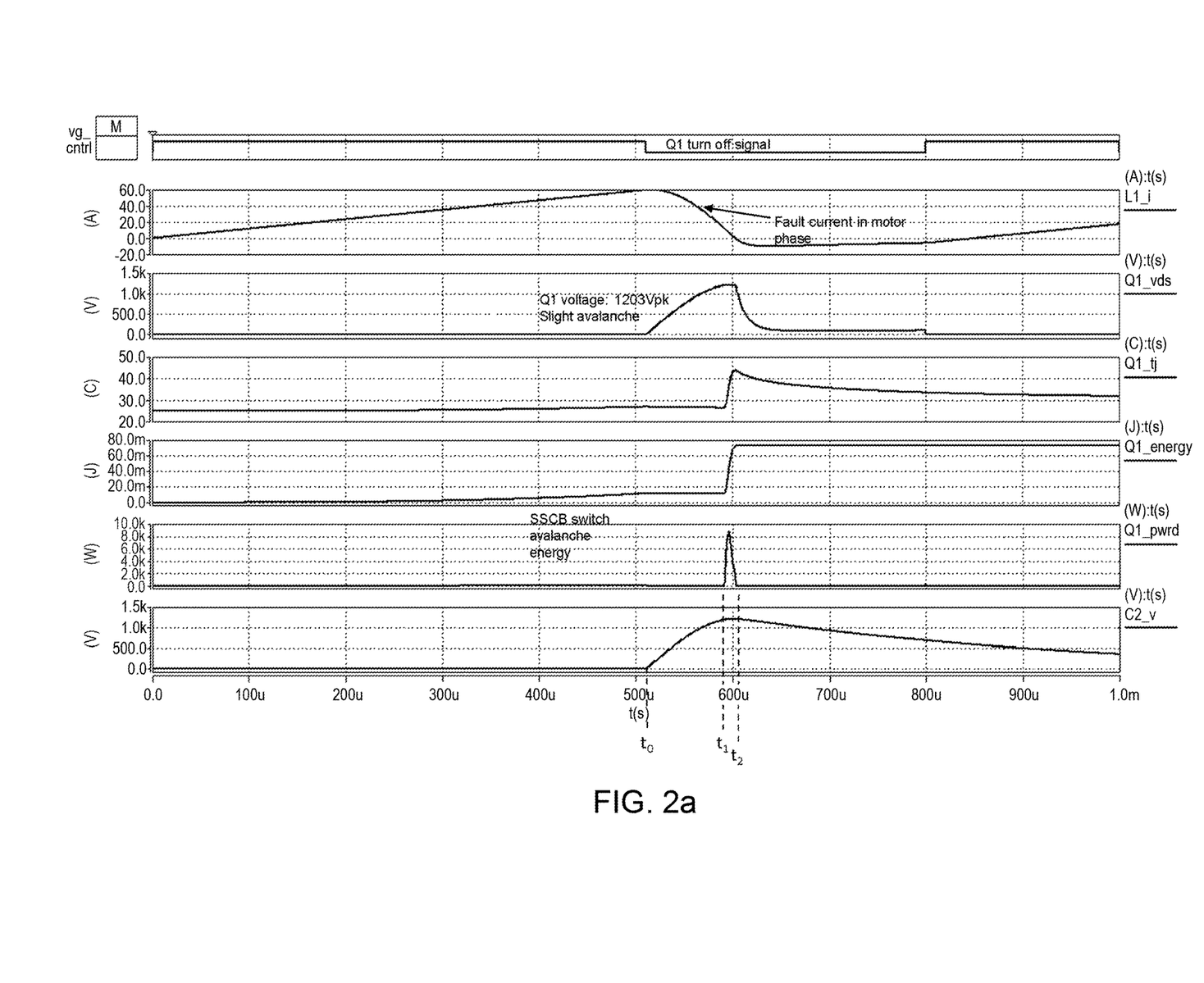
FIG. 2a shows the waveforms for the circuit of FIG. 2.

FIG. 2 shows a typical RCD snubber. Snubbers are typically used to divert energy away from the solid state device of the SSCB in the event of abrupt current interruption to prevent damage to the SSCB. The RCD snubber consists of a capacitor 10 connected in series with a parallel connected diode 12 and resistor 14 connected in parallel with the SSCB switch 20. 3-phase loads require a back-to-back snubber configuration as shown in FIG. 2 per phase, which means that six capacitors are required for the three phases. When the current is interrupted at to energy stored in the inductive load is diverted away from switch 20 and instead transferred to the capacitor 10 (via diode 12), thereby minimising switch 20 avalanche mode duration $t_1 \sim t_2$. The voltage across the capacitor 10 thus clamps the voltage across the switch 20 to a level at or below the switch breakdown voltage and as a result, the power dissipation in switch 20 is very low. As shown in FIG. 2a, at $t_2$, the energy transfer from the inductive load to the snubber capacitor is complete. The energy stored by the capacitor 10 is then gradually dissipated by resistor 14, allowing capacitor 10 voltage to discharge towards zero, as indicated by (C2_v). A comparison of the second plot of the graph of FIG. 1a with that of FIG. 2a shows that the snubber either prevents the switch voltage reaching avalanche or minimises the avalanche duration. Such snubbers, however, require the capacitor to be rated to avoid avalanche of the MOSFET (or other solid state device) which means that in many applications, the capacitor needs to be large and also expensive.

Figure 3:
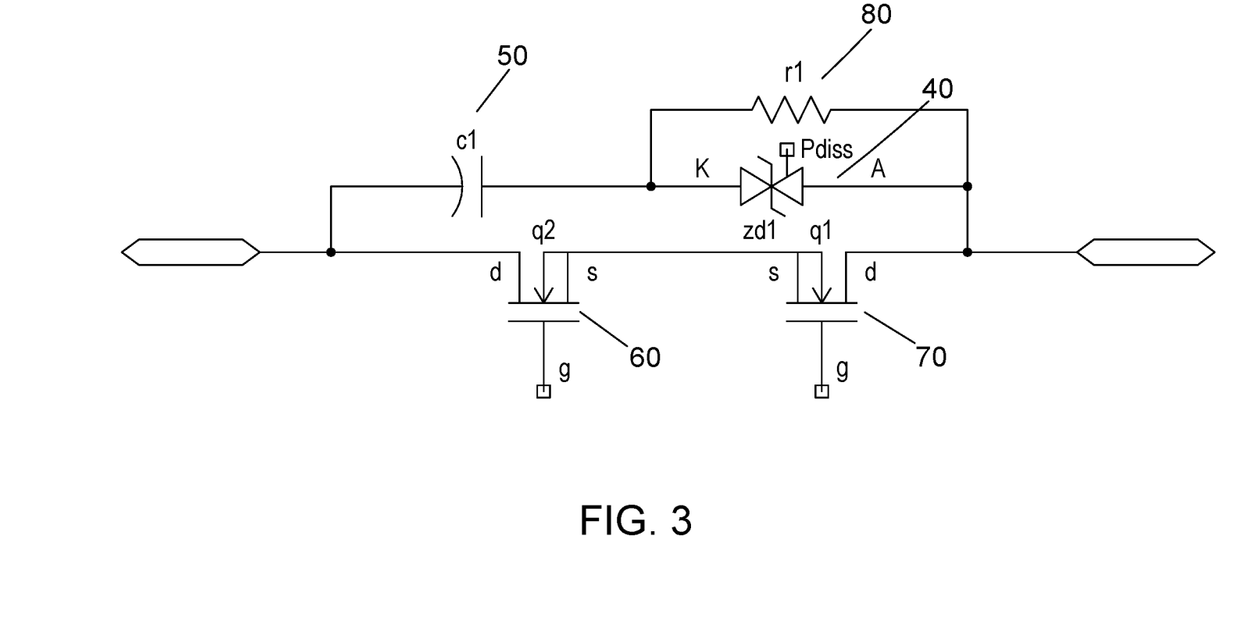
FIG. 3 shows a DC implementation of a bi-directional SSCB snubber circuit according to the disclosure.

The present disclosure replaces the conventional RCD snubber circuit with a modified snubber design an example of which is shown in FIG. 3. The snubber circuit comprises a series connected transient voltage suppressor (TVS) 40 and a capacitor 50 connected across the switches 60, 70. The circuit shown in FIG. 3 is for a standard single phase DC application. For an AC application, such a circuit would be provided for each phase. A back-to-back design is still required, but in the snubber of the disclosure this is formed using a single TVS and a single capacitor. By using a combination of a TVS and a capacitor some of the energy from the inductive load will be dissipated by the TVS 40 and some will be stored by capacitor 50 and more slowly dissipated by the resistor 80. This avoids all of the energy being dissipated across the switch devices 60, 70. The capacitor does not dissipate energy power—this is done by the TVS, but because the TVS does not have to dissipate all of the energy it can be designed to have a lower peak pulse power rating than if the capacitor was not present to absorb some of the energy.

Figure 4:
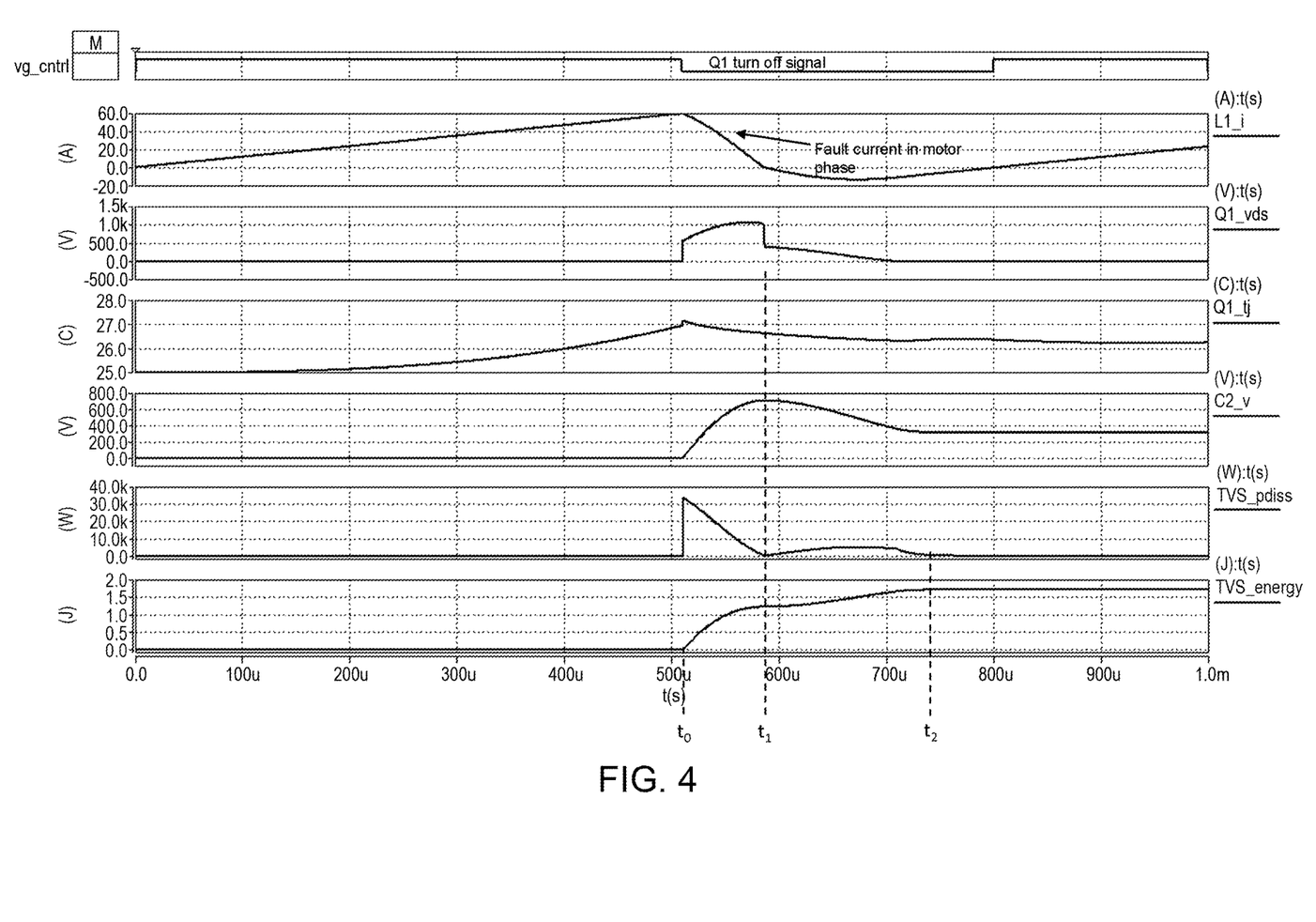
FIG. 4 shows the time-line for a circuit such as shown in FIG. 3.

Operation of the modified snubber will now be described with reference to the time graph of FIG. 4.

At $t_0$, the switch 70 turns off and the current falls during $t_0 \sim t_1$ period. Similarly to the arrangement in FIG. 2, the inductive load energy begins to charge the capacitor 50 (C2_v in the fourth row of the graph). At the same time the TVS 40 begins to conduct thus clamping the switch voltage to below the avalanche voltage (Q1_vds in the second row of the graph). By time $t_1$, all of the inductive load energy has either been transferred to the snubber capacitor 50 or has been dissipated in the TVS 40. Between times $t_1$ and $t_2$, the capacitor discharges some of the energy back to the inductive load via the TVS until the TVS conduction ceases i.e. when the terminal voltage is less than the rated breakdown voltage. Resistor 80 provides a discharge path for the remaining energy stored on capacitor 50 beyond $t_2$. As mentioned above, using the capacitor and the TVS in combination to deal with the energy spike means that relatively low peak pulse power TVS devices and relatively low rated capacitors can be used. The device is therefore simpler, smaller and less expensive. In addition, the presence of the capacitor 50 mitigates the risk of damage if the TVS fails. It is also not necessary to carefully size the components to avoid switch avalanche.

Figure 5:
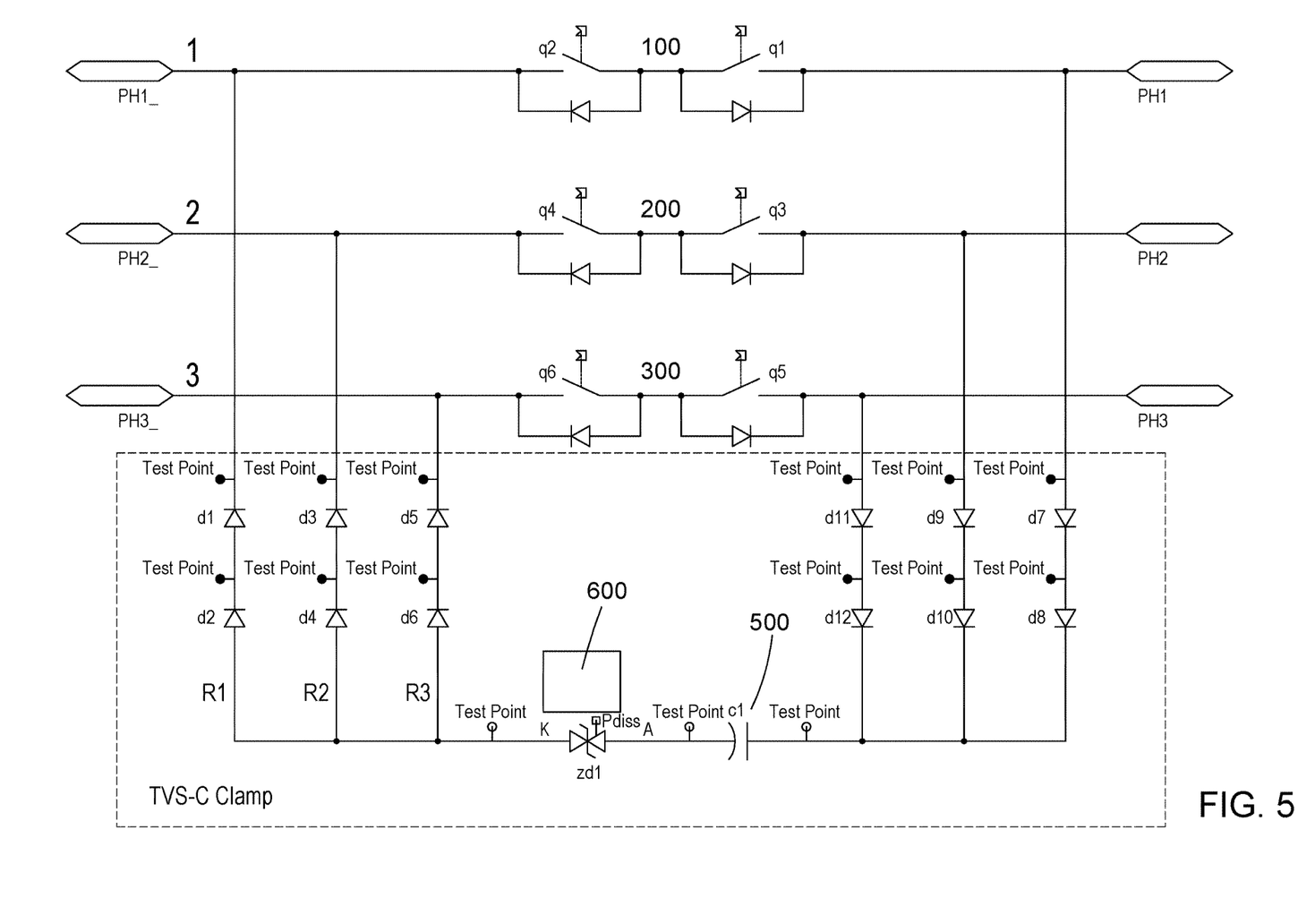
FIG. 5 shows a 3-phase implementation of a circuit according to the disclosure.

FIG. 5 shows how the snubber circuit can be used in a 3-phase AC application. A single TVS/capacitor snubber circuit as discussed above can be used for all three phases 1, 2, 3 with switches 100, 200, 300 if rectifiers R1, R2, R3 are provided at the AC phase outputs. As seen in FIG. 5, the common snubber for all three phases includes a capacitor 500 and a TVS 600 connected in series across each switch 100, 200, 300 via a respective rectifier R1, R2, R3.

For 3-phase applications using a conventional RCD snubber, a separate snubber would be required for each phase, each snubber requiring two suitably rated (I.e. relatively large) capacitors, so six capacitors in total or two high power rated TVS per phase (again, six in total) would be required.

Figure 6:
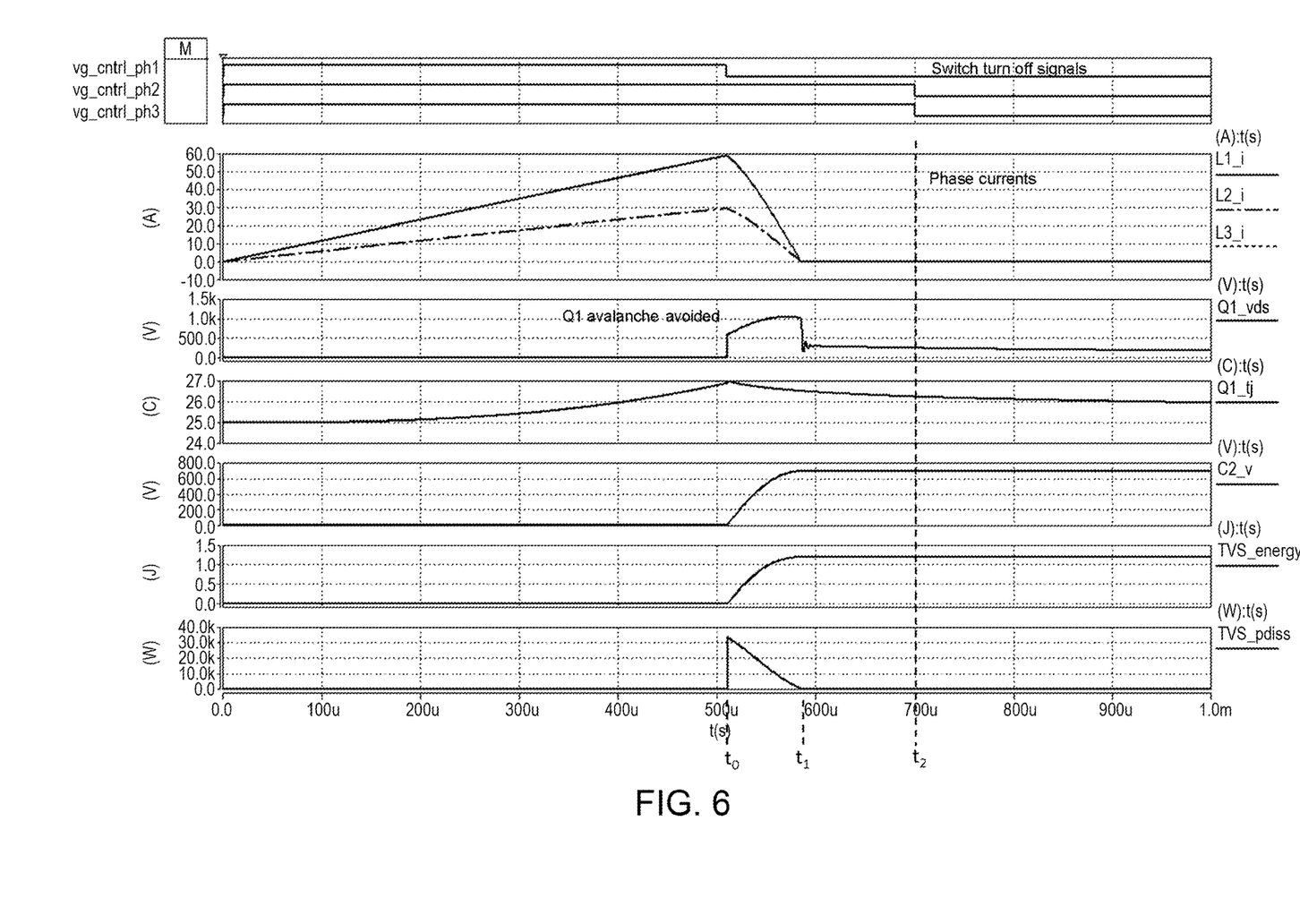
FIG. 6 shows the time-line of the 3-phase implementation.

The behaviour of the snubber of FIG. 5 can be seen in FIG. 6. When the switch is turned off at to, the stored energy is diverted to the TVS—capacitor circuit thus avoiding switch avalanche.

The invention claimed is:

1. A bidirectional solid state circuit breaker (SSCB) comprising: a main SSCB circuit configured to be connected between a three-phase alternating current (AC) power supply and a load, the main SSCB circuit comprising first and second semiconductor switches connected in series for each of three phases of the three-phase AC power supply, and a single snubber circuit having a first end connected to a first end of the first semiconductor switch and a second end connected to a second end of the second semiconductor switch for all of the three phases, the single snubber circuit comprising a capacitor and a transient voltage suppressor (TVS) connected in series.

2. The bidirectional SSCB of claim 1, further comprising rectifiers configured to rectify each of the three phases.

3. The bidirectional SSCB of claim 1, wherein the first and second semiconductor switches are MOSFETs.

4. The bidirectional SSCB of claim 1, wherein the first and second semiconductor switches are Si MOSFETS.

5. The bidirectional SSCB of claim 1, wherein the first and second semiconductor switches are SiC MOSFETS.

6. The bidirectional SSCB of claim 1, wherein the first and second semiconductor switches are GaN MOSFETS.

7. The bidirectional SSCB of claim 1, wherein: the single snubber circuit further comprises a resistor coupled in parallel with the TVS but not the capacitor; and the TVS is configured to dissipate energy from the load, the capacitor is configured to store energy from the load, and the resistor is configured to dissipate energy from the load more slowly than the TVS.

8. An assembly comprising: a three-phase alternating current (AC) voltage supply and a load to which voltage from the voltage supply is provided; and a bidirectional solid state circuit breaker (SSCB) between the voltage supply and the load, the bidirectional SSCB comprising: a main SSCB circuit connected between the voltage supply and the load, the main SSCB circuit comprising first and second semiconductor switches connected in series for each of three phases of the voltage supply, and a single snubber circuit having a first end connected to a first end of the first semiconductor switch and a second end connected to a second end of the second semiconductor switch for all of the three phases, the single snubber circuit comprising a capacitor and a transient voltage suppressor (TVS) connected in series.

9. The assembly of claim 8, wherein the load comprises a power distribution system.

10. The assembly of claim 8, wherein the load comprises a motor.

11. The assembly of claim 8, wherein the first and second semiconductor switches are MOSFETs.

12. The assembly of claim 8, wherein the first and second semiconductor switches are Si MOSFETS, SiC MOSFETS, or GaN MOSFETS.

13. The assembly of claim 8, wherein: the single snubber circuit further comprises a resistor coupled in parallel with the TVS but not the capacitor; and the TVS is configured to dissipate energy from the load, the capacitor is configured to store energy from the load, and the resistor is configured to dissipate energy from the load more slowly than the TVS.

14. The assembly of claim 8, wherein the bidirectional SSCB further comprises rectifiers configured to rectify each of the three phases.

15. A method of dissipating voltage spikes from switching off an inductive load using a bidirectional solid state circuit breaker (SSCB) configured to be connected between at three-phase alternating current (AC) power supply and the inductive load, the bidirectional SSCB comprising first and second semiconductor switches connected in series for each of three phases of the three-phase AC power supply, the method comprising; providing a single snubber circuit across the first and second semiconductor switches of the bidirectional SSCB for all of the three phases, wherein the single snubber circuit comprises a capacitor and a transient voltage suppressor (TVS) connected in series.

16. The method of claim 15, wherein the first and second semiconductor switches are MOSFETs.

17. The method of claim 15, wherein the first and second semiconductor switches are Si MOSFETS, SiC MOSFETS, or GaN MOSFETS.

18. The method of claim 15, wherein the bidirectional SSCB further comprises rectifiers that rectify each of the three phases.

19. The method of claim 15, wherein the inductive load is a motor or a power distribution system.

20. The method of claim 15, wherein: the single snubber circuit further comprises a resistor coupled in parallel with the TVS but not the capacitor; and the TVS dissipates energy from the inductive load, the capacitor stores energy from the inductive load, and the resistor dissipates energy from the inductive load more slowly than the TVS.

\* \* \* \* \*